(12) United States Patent
Miura

(10) Patent No.: US 8,187,389 B2
(45) Date of Patent: May 29, 2012

(54) METHOD OF REMOVING RESIST AND APPARATUS THEREFOR

(75) Inventor: Toshinori Miura, Yaizu (JP)

(73) Assignee: Meidensha Corporation, Tokyo (JP)

( * ) Notice: Subject to any disclaimer, the term of this patent is extended or adjusted under 35 U.S.C. 154(b) by 0 days.

(21) Appl. No.: 12/598,501

(22) PCT Filed: May 8, 2008

(86) PCT No.: PCT/JP2008/058577
§ 371 (c)(1), (2), (4) Date: Nov. 2, 2009

(87) PCT Pub. No.: WO2008/143017
PCT Pub. Date: Nov. 27, 2008

(65) Prior Publication Data
US 2010/0139708 A1    Jun. 10, 2010

(30) Foreign Application Priority Data

May 23, 2007 (JP) ................................. 2007-137288

(51) Int. Cl.
*B08B 3/04* (2006.01)
(52) U.S. Cl. ............. 134/30; 134/1.1; 134/1.2; 134/1.3; 134/10; 134/21; 134/25.1; 134/25.4; 134/26; 134/27; 134/31; 134/34; 134/35; 134/36; 134/37; 134/42; 134/902; 510/175; 510/176; 216/58; 438/706; 438/714; 438/715; 438/725; 438/906
(58) Field of Classification Search ............... 134/1.1, 134/1.2, 1.3, 10, 21, 25.1, 25.4, 26, 27, 30, 134/31, 34, 35, 36, 37, 42, 902; 510/175, 510/176; 216/58; 438/706, 714–715, 725, 438/906
See application file for complete search history.

(56) References Cited

U.S. PATENT DOCUMENTS 6,231,676 B1 * 5/2001 Rudd et al. ..................... 134/1
(Continued)

FOREIGN PATENT DOCUMENTS

CN    1659481(A)    8/2005
(Continued)

OTHER PUBLICATIONS

U.S. Appl. No. 12/743,275, filed May 17, 2010, Toshinori Miura.

*Primary Examiner* — Bibi Carrillo
(74) *Attorney, Agent, or Firm* — Foley & Lardner LLP

(57) ABSTRACT

A resist removing device 1 functions to remove a resist from a substrate while preventing occurrence of popping phenomenon and at the same time attains reduction in cost of energy for the resist removing and has a simplified constitution. The resist removing device 1 is equipped with a chamber 2 for containing therein a substrate 16 (for example, a substrate having a high-doze ion implanted resist), and with a pressure below the atmospheric pressure, the chamber 2 is fed with ozone gas, unsaturated hydrocarbons and water vapor. The ozone gas may be an ultra-high concentrated ozone gas that is produced by subjecting an ozone containing gas to a liquefaction-separation with the aid of a vapor pressure difference and then vaporizing the liquefied ozone. For cleaning the substrate 16 thus treated, it is preferable to use ultra-pure water. The chamber 2 is equipped with a susceptor 15 for holding the substrate 16. The susceptor 15 is heated to a temperature of 100° C. or below. An example of the means of heating the susceptor is a light source that emits infra-red rays.

5 Claims, 7 Drawing Sheets

U.S. PATENT DOCUMENTS

| | | | |
|---|---|---|---|
| 6,551,409 B1 | 4/2003 | Degendt et al. | |
| 6,616,773 B1 | 9/2003 | Kuzumoto et al. | |
| 6,634,368 B1 * | 10/2003 | Jung et al. | 134/1.3 |
| 6,696,228 B2 | 2/2004 | Muraoka et al. | |
| 6,955,178 B1 | 10/2005 | Kuzumoto et al. | |
| 2001/0027023 A1 | 10/2001 | Ishihara | |
| 2002/0011257 A1 | 1/2002 | Degendt et al. | |
| 2002/0088478 A1 | 7/2002 | Degendt et al. | |
| 2003/0108823 A1 | 6/2003 | Muraoka et al. | |
| 2004/0076912 A1 | 4/2004 | Muraoka et al. | |
| 2004/0221877 A1 * | 11/2004 | Bergman | 134/34 |
| 2006/0137723 A1 * | 6/2006 | Bergman | 134/34 |
| 2007/0054492 A1 * | 3/2007 | Elliott et al. | 438/689 |
| 2007/0077769 A1 | 4/2007 | Degendt et al. | |
| 2007/0107751 A1 * | 5/2007 | Tokuno et al. | 134/10 |
| 2007/0254489 A1 * | 11/2007 | Kawaguchi et al. | 438/727 |
| 2007/0272359 A1 * | 11/2007 | Kawaguchi et al. | 156/345.32 |
| 2008/0099040 A1 * | 5/2008 | Bahng et al. | 134/1.3 |
| 2008/0102646 A1 * | 5/2008 | Kawaguchi et al. | 438/725 |

FOREIGN PATENT DOCUMENTS

| | | |
|---|---|---|
| JP | 64-081318 A | 3/1989 |
| JP | 4-150013 A | 5/1992 |
| JP | 5-074742 A | 3/1993 |
| JP | 8-069896 A | 3/1996 |
| JP | 8-139004 A | 5/1996 |
| JP | 9-027473 A | 1/1997 |
| JP | 11-219926 A | 8/1999 |
| JP | 2001-223206 A | 8/2001 |
| JP | 2001-304756 A | 10/2001 |
| JP | 2001-308078 A | 11/2001 |
| JP | 2003-020209 A | 1/2003 |
| JP | 2003-188137 A | 7/2003 |
| JP | 2003-273059 A | 9/2003 |
| JP | 2003-330206 A | 11/2003 |
| JP | 2006-156919 A | 6/2006 |
| JP | 2006-294842 A | 10/2006 |
| TW | 200509246 | 3/2005 |
| WO | WO03/104900 (A2) | 12/2003 |

* cited by examiner

PMMA poly (methyl methacrylate)
poly[1-(methoxycarbonyl)-1-methylethylene]
RESIST BASE POLYMER FOR ArF poly[1-(4-hydroxyphenyl)ethylene]
poly(4 or p-vinylphenol)
poly(p-hydroxystyrene)
RESIST BASE POLYMER FOR KrF Novolak RESIN
RESIST BASE POLYMER FOR G-LINE & I-LINE ent interval of production machines, throughput of the
METHOD OF REMOVING RESIST AND APPARATUS THEREFOR

TECHNICAL FIELD

The present invention relates to a technology for removing a resist, especially a high-dose ion implanted resist, which is formed on a substrate surface in a production process of semiconductor devices.

BACKGROUND ART

As a technology for removing a high-dose ion implanted resist formed on a substrate, there have been proposed various techniques that are disclosed in the following Patent Documents.

A plasma treatment method and an apparatus that practically uses the method are disclosed in Patent Document 1 in which a plasma treatment is applied to a substrate using a helicon wave plasma treatment with the aid of a substrate bias induction means and a substrate heating means. Concretely, a resist mask formed on a substrate is removed by employing both an ion mode heavy plasma treatment using a high ion current with a helicon wave plasma and a radical mode heavy plasma treatment using an non-resonance inductive coupling plasma.

Another plasma treatment method and an apparatus that practically uses the method are disclosed in Patent Document 2 in which an ashing treatment is applied to a hardened degeneration layer of a resist mask on a substrate by a plasma treatment device that has a helicon plasma generator with a transparent bell-jar made of a dielectric material that is transparent to an UV light. In a subsequent step, a non-degeneration layer of the resist mask on the substrate is subjected to an ashing by an UV light radiation in ozone gas.

A resist removing method and an apparatus that practically used the method are disclosed in Patent Document 3 in which a substrate is heated to cause a resist on a surface of a substrate to have a popping phenomenon. After the substrate is cooled, the resist is peeled off by using an adhesive tape and then an ashing is continuously carried out by a combination of oxygen plasma and ozone gas or that of an UV light and ozone gas.

In a high-dose ion implanted resist, a hardened layer is formed on the surface of the substrate like a film. Since a soft resist (non-degeneration layer) is provided beneath the resist, heating the substrate at a high temperature, for example, above 400° C. tends to induce so-called popping phenomenon in which the surface of the substrate is cracked and blown off by an exhaust gas from the non-degeneration under layer and a thermal expansion difference. The blown off hardened layer of the substrate surface contaminates not only the substrate but also an interior of a chamber that holds therein the substrate. Accordingly, the resist removing method described in Patent Document 3 by way of example in which a heating process is used fails to have a satisfied yield of production of devices. Furthermore, since it is necessary to shorten a maintenance interval of production machines, throughput of the substrates is affected.

While, the treatment methods disclosed in Patent Documents 1 and 2 are suppressed from suffering from the popping phenomenon. However, in such methods, it is necessary to provide a plasma generator. The Plasma generator is expensive and if such plasma generator is provided, an device for removing the resist is entirely increased in size. Furthermore, it causes increase in cost of energy required for a resist removing.

Patent Document 1: Japanese Laid-open Patent Application (Tokkaihei) 8-69896.
Patent Document 2: Japanese Laid-open Patent Application (Tokkaihei) 8-139004.
Patent Document 3: Japanese Laid-open Patent Application (Tokkaihei) 9-27473.

DISCLOSURE OF THE INVENTION

In order to solve the above-mentioned drawbacks, there is provided a method of removing a resist, in which for removing the resist on a substrate, ozone gas, unsaturated hydrocarbon gas and water vapor are supplied to the substrate under a pressure lower than the atmospheric pressure.

Furthermore, a resist removing apparatus for solving the above-mentioned drawbacks is equipped with a chamber for housing therein a substrate and ozone gas, unsaturated hydrocarbon gas and water vapor are supplied to the chamber under a pressure lower than the atmospheric pressure.

According to the above-mentioned resist removing method and resist removing apparatus, the resist removing can be effected at a temperature of 100° C. or below, and thus, even in a treatment to a high-dose ion implanted resist, the undesired popping phenomenon is suppressed. Furthermore, since removal of the resist from the substrate is carried out under a reduced pressure lower than the atmospheric pressure, safety is guaranteed even if high concentration ozone gas, which has a risk of explosion, is used. Examples of the above-mentioned unsaturated hydrocarbon gas are hydrocarbons (Alkenes) having double bonds of carbons such as ethylene gas, hydrocarbons (Alkynes) having triple bonds of carbons such as acetylene and hydrocarbons of low molecular weight such as butylene etc,.

In the above-mentioned resist removing apparatus, supplying the zone gas may be carried out by an ozone gas generating device that generates an ultra-high concentrated ozone gas by subjecting an ozone containing gas to a liquefaction-separation with the aid of a vapor pressure difference and then vaporizing the liquefied ozone. The resist can be effectively removed by using the ultra-high concentrated ozone gas. It is to be noted that the ozone gas is not limited to the above-mentioned ultra-high concentrated ozone gas.

In case of removing an ion implanted resist, ultra-pure water may be preferably supplied to a substrate that has been treated by ozone gas, unsaturated hydrocarbon gas and water vapor. This is because in case wherein ions are implanted in semiconductor production process, the ions produces, in almost cases, compounds with low vapor pressure by oxidizing reaction, and thus, even after the resist is completely removed, the compounds thus produced are left on the substrate surface forming a residue thereon. However, such residue forms water-soluble compounds, and thus the residue can be easily moved by ultra-pure water.

In the above-mentioned resist removing method and resist removing apparatus, a measure may be employed in which the substrate is supported by a susceptor and the susceptor is heated and controlled to have a temperature below 100° C. With this measure, the damage to the substrate base is reduced. Furthermore, in case of the high-dose ion implanted resist, removing of the resist can be carried out while assuredly suppressing undesired popping phenomenon. Furthermore, even if an easily oxidizing substance (for example Cu wiring etc.) is provided beneath the resist, the oxidation can be controlled to the minimum level. As the means for heating the susceptor, a light source emitting infra-red rays may be used. The heating means may be just a device that can heat the susceptor, and thus the heating means is not limited to the above-mentioned light source. That is, various types of heating means such as a heater, an induction heater and the like may be used and in addition to these, a structure having the various types of heater installed in the susceptor may be used.

Accordingly, in the above-mentioned invention, a resist can be removed at a low temperature of 100° C. or below. In particular, such resist removing can be carried out while suppressing generation of the undesired popping phenomenon. Furthermore, the energy cost needed for the resist removing can be reduced and the device construction can be simplified.

BEST MODE(S) FOR CARRYING OUT THE INVENTION

Figure 1:
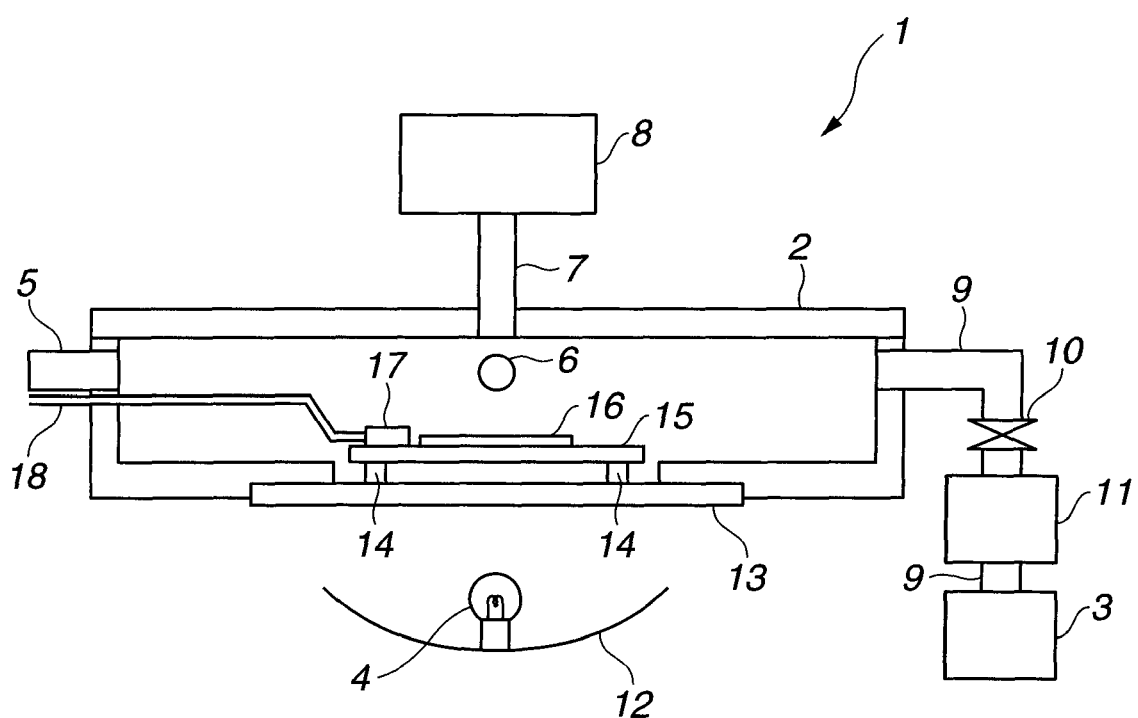
FIG. 1 is a cross sectional view schematically showing a constitution of a resist removing apparatus, which is an embodiment of the present invention.

FIG. 1 is a cross sectional view schematically showing a construction of a resist removing apparatus, which is an embodiment of the present invention.

The resist removing apparatus 1 is equipped with a chamber 2, a vacuum pump 3 and a light source 4.

Figure 8:
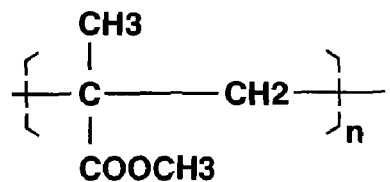
FIG. 8 shows molecular structures of various resists.
Figure 8:
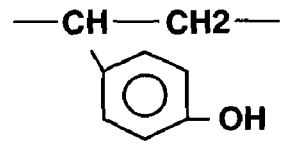
Figure 8:
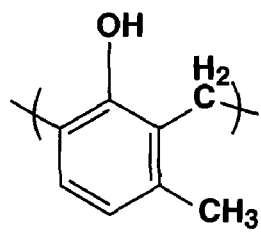

The chamber 2 houses therein a substrate 16 that is to be subjected to a resist removing, and into the chamber 2, there are led ozone gas ($O_3$), unsaturated hydrocarbon gas and water vapor ($H_2O$). Examples of the resist are a resist for ArF, a resist for KrF, and a resist for G-line and I-line etc., as shown in FIG. 8.

Examples of the unsaturated hydrocarbons are hydrocarbons (Alkenes) having double bonds of carbons such as ethylene gas, and hydrocarbons (Alkynes) having triple bonds of carbons such as acetylene.

As the ozone gas, ultra-high concentrated ozone gas is used. For example, the ultra-high concentrated ozone gas is produced from an ozone containing gas by subjecting the ozone-containing gas to a liquefaction-separation with the aid of a vapor pressure difference and then vaporizing the liquefied ozone. More specifically, the ozone gas produced by ozone producing devices disclosed by Patent Documents such as Japanese Laid-open Patent Application (Tokkai) 2001-304756 and Japanese Laid-open Patent Application (Tokkai) 2003-20209 is usable. In the above-mentioned ozone producing devices, based on a difference in vapor pressure between an ozone gas and other gas component (for example, oxygen), only the ozone is separated by liquefaction to produce the ultra-high concentrated ozone gas (ozone concentration=100%). An ozone supplying device disclosed by Japanese Laid-open Patent Application (Tokkai) 2003-20209 has a plurality of chambers in which only the ozone is liquefied and vaporized, and the plurality of chambers are separately controlled in temperature to continuously supply the ultra-high concentrated ozone gas. An example of commercially sold ozone producing devices produced based on the ultra-high concentrated ozone gas continuously supplying system is the Pure Ozone Generator (MPOG-HM1A1) produced by Meidensha Corporation.

It is to be noted that the ozone gas is not limited to the above-mentioned ultra-high concentrated ozone gas. For example, ozone gas with the ozone concentration of several 10% or more is usable. Under the atmospheric pressure, the ozone gas having the ozone concentration of 14.3~38 vol % exhibits a continuous decomposition region, the ozone gas having the ozone concentration of ~44 vol % exhibits an abrupt firing region and the ozone gas having the ozone concentration of 44 vol %~exhibits an explosion region (Hidetoshi Sugimitsu: Fundamentals and Applications of Ozone, Kourin-sha, 1996, pp. 187).

Figure 9:
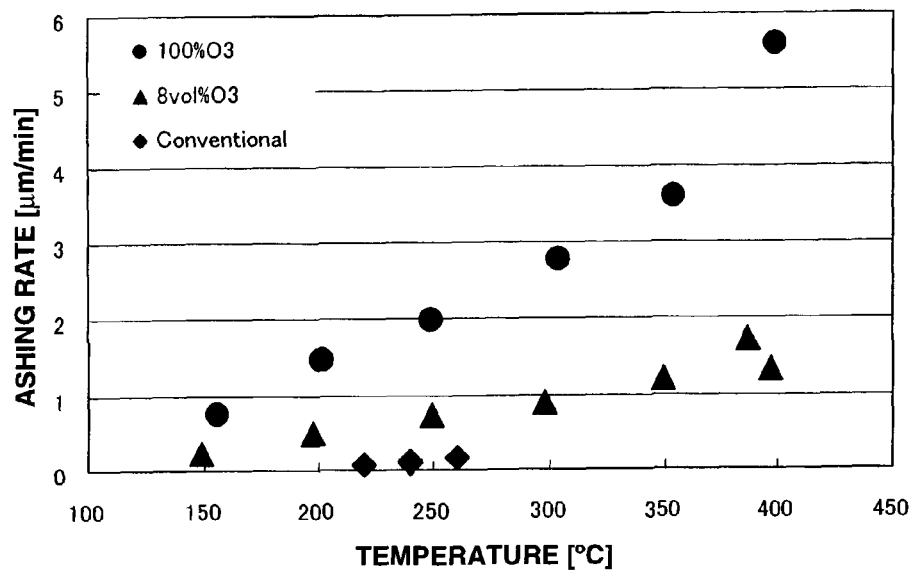
FIG. 9 is a characteristic graph showing a relation between a substrate temperature [° C.] and an ashing rate [μm/min] in a case wherein a Si-substrate is subjected to an ashing treatment by only using ozone gases (ultra-high concentrated ozone gas (ozone concentration≈100 vol %), ozone gas with an ozone concentration of 8 vol %, and conventional ozone gas).
Figure 10:
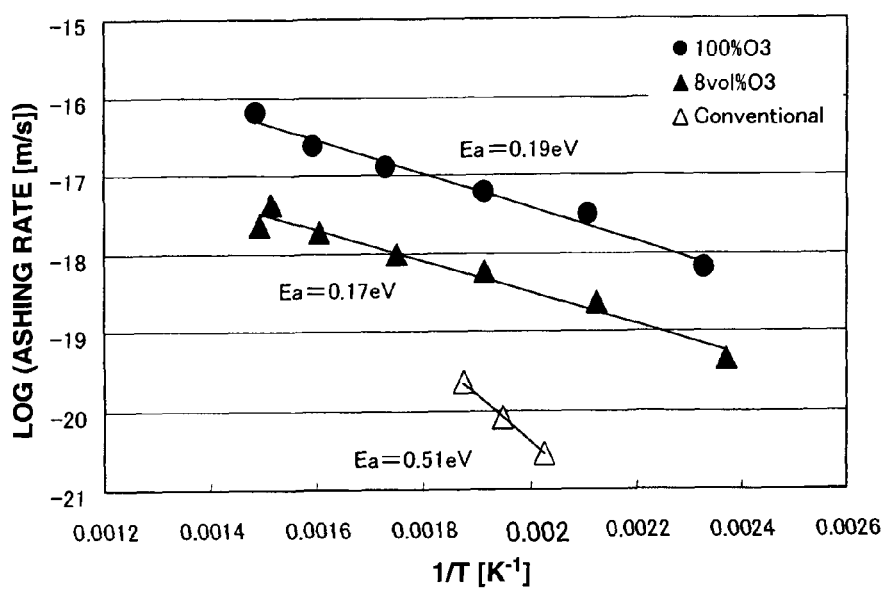
FIG. 10 is a characteristic graph of Arrhenius plot in a case wherein a Si-substrate is subjected to an ashing treatment by only using ozone gases (ultra-high concentrated ozone gas (ozone concentration≈100 vol %), ozone gas with an ozone concentration of 8 vol %, and conventional ozone gas).

FIG. 9 is a characteristic graph showing a relation between a substrate temperature [° C.] and an ashing rate [μm/min] in a case wherein a Si-substrate is subjected to an ashing treatment by only using ozone gases (ultra-high concentrated ozone gas (ozone concentration≈100 vol %), ozone gas with an ozone concentration of 8 vol %, and conventional ozone gas). FIG. 10 is a characteristic graph of Arrhenius plot in a case wherein a Si-substrate is subjected to an ashing treatment by only using ozone gases (ultra-high concentrated ozone gas (ozone concentration≈100 vol %), ozone gas with an ozone concentration of 8 vol %, and conventional ozone gas). The ultra-high concentrated ozone gas used was the ozone gas generated by Ozone Generator (MPOG-HM1A1) produced by Meidensha Corporation. The letter "Conventional" means a case in which the ashing treatment was carried out by using a conventional resist removing device (UV DRY STRIPPER/CLEENER MODEL UV-300H produced by SAMCO Inc.) that uses a conventional ozone gas. In this "Conventional" resist removing device, irradiation of UV light is carried out under the atmospheric pressure while forcing a low concentrated ozone gas (ozone concentration≈2 vol %) to flow. As is seen from these characteristic graphs, it has been recognized that usage of the ultra-high concentrated ozone gas brings about a remarkable increase in the ashing rate (viz., the effect of the resist removing).

Figure 4:
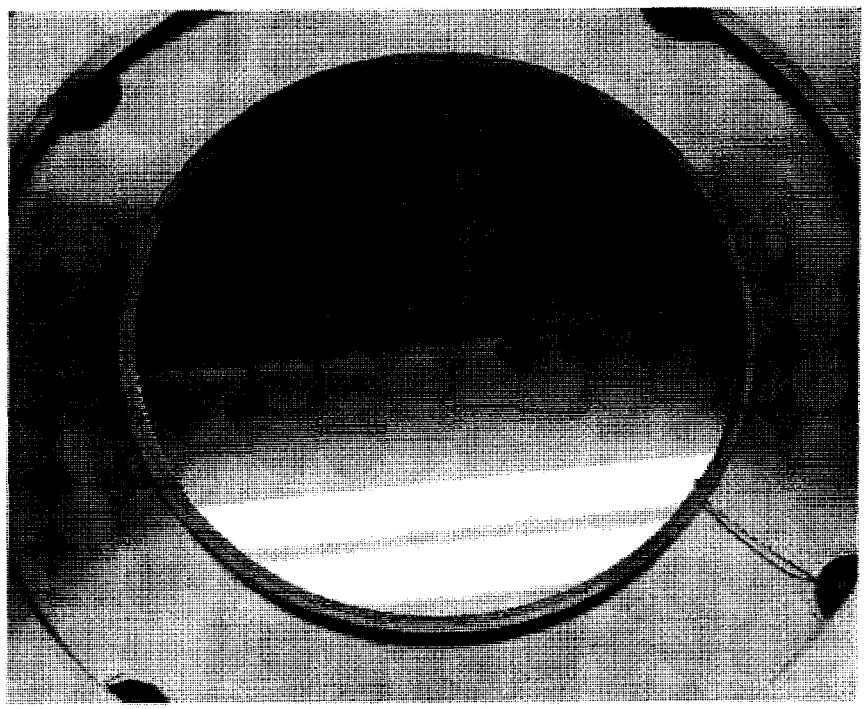
FIG. 4 is an appearance photo of a substrate surface that has been treated by a resist removing method using only ozone gas of an ozone concentration of 100 vol %.

And, the applicant has recognized that the high-dose ion implanted resist can be removed by the treatment that is carried out at a temperature of 400° C. using the ultra-high concentrated ozone gas (FIG. 4).

However, it was recognized after checking the interior of the chamber that a surface hardened layer of the resist in the form of film-like fine particles adhered to walls of the chamber interior and found that the popping phenomenon still happened during heating because of the high temperature treatment. Accordingly, the applicant made a further research development for achieving a technology of the high-dose ion implanted resist removal while suppressing occurrence of the popping phenomenon.

The unsaturated hydrocarbon gas is supplied through a pipe 5. The water vapor is supplied through a pipe 6. While, the ozone gas is supplied through a pipe 7. The pipe 7 is placed on a lid that hermetically covers the chamber 2. This lid is hermetically put on the chamber 2 through an auxiliary sealing member. As the auxiliary seating member, an O-ring made of ozone resistance material such as silicon gum is usable.

A vacuum pump 3 is a means for reducing the pressure in the chamber 2. A pipe 9 connecting the chamber 2 with the vacuum pump 3 is provided with both an exhaust valve 10 and an ozone killer 11. The exhaust valve 10 functions to seal the gas in the chamber 2 in such a manner that the pressure in the chamber 2 has a predetermined value. The ozone killer 11 functions to decompose ozone contained in the gas withdrawn from the chamber 2. The ozone killer 11 may be a known ozone decomposition device that is used in semiconductor production technologies.

The light source 4 functions to heat the substrate 16 that is housed in the chamber 2. The light source 4 is arranged at a lower portion of the chamber 2. The light source 4 may be an infra-red ray emitting light source that is used in the semiconductor production technologies as a heating means. Preferably, the light source 4 is equipped with a reflector 12 for concentrating the radiating light. On the other hand, at a bottom portion of the chamber 2, there is provided a light inlet window 13 through which the infra-red rays from the light source 4 are led. to the light inlet window 13, there is mounted a susceptor through a supporting member 14.

The susceptor 15 functions to support the substrate 16. The susceptor 15 is placed at a position just beneath a confluence point where the ozone gas, the unsaturated hydrocarbons and the water vapor join together. The susceptor 15 is equipped with a thermal conduction block 17. The thermal conduction block 17 is connected to a thermo-couple 18. The thermo-couple 18 functions to convert a heat, which is detected for controlling the heat of the susceptor 15, to an electric signal, and feed the electric signal to a control means (not shown).

In the following, operation of the resist removing device 1 will be described with reference to FIG. 1 to FIG. 3.

The exhaust valve 10 is set to be fully open, and ethylene gas, as unsaturated hydrocarbons, is fed to the chamber 2. The ultra-high concentrated gas is supplied to the chamber under an internal pressure of about 350 Pa of the chamber 2 and kept in a stable condition for about 30 minutes. And, once the internal pressure of the chamber 2 reaches a value of about 700 Pa, stabilizing is applied to the chamber 2 for about one minute. Furthermore, the water vapor is supplied and then a suitable treatment is carried out for about 4 minutes under pressure of about 1500 Pa. Thereafter, supply of the ultra-high concentrated ozone gas is stopped, and then supply of the ethylene gas is stopped. And after about 30 seconds, supply of the water vapor is stopped. During this procedure, the resist component made of hydrocarbons is forced to change to an exhaust gas consisting of carbon dioxide gas and water and drawn from the chamber 2 through the pipe 9.

Figure 2:
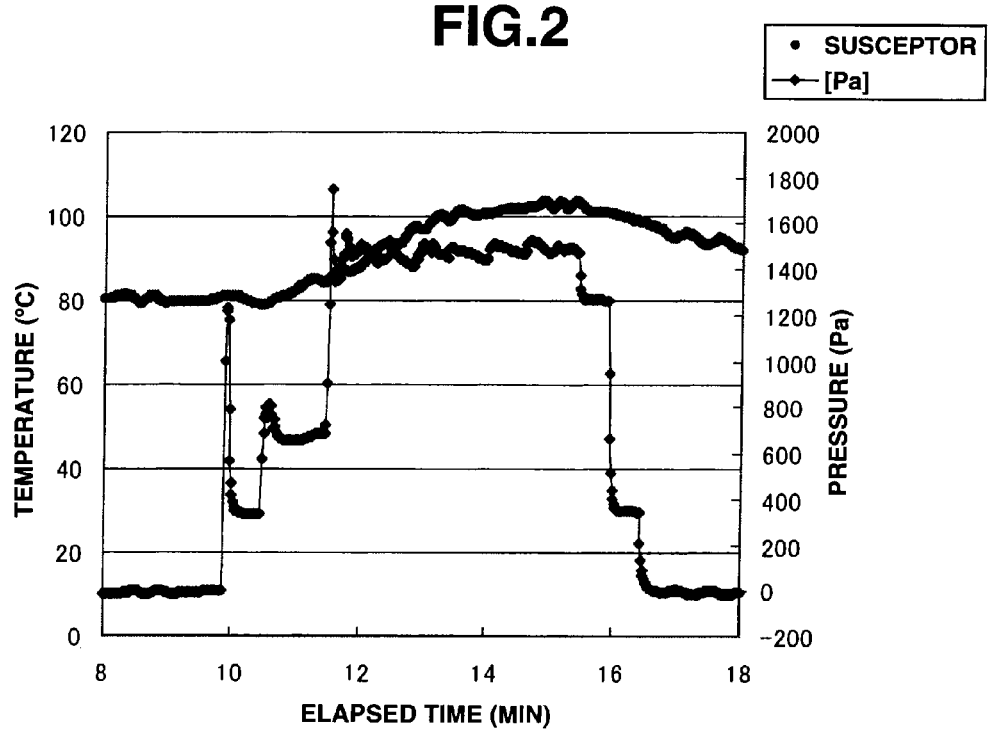
FIG. 2 is a graph showing a change of a susceptor temperature and that of a chamber pressure with respect to elapsed time.

An example of a change with a passage of time of the susceptor temperature and the chamber pressure in the above-mentioned process is depicted by FIG. 2. This characteristic graph was obtained by controlling a gas supply with only manual valves, without controlling the gas supply by MFCs (mass flow controller). Namely, in order to avoid a rapid pressure change, the open/close operation of the valves was carried out as slowly as possible, and thus a stabilizing time is provided for the interior pressure of the chamber each time each gas was supplied. Accordingly, if the supply system of each gas is equipped with MFC, the control of the internal pressure and the temperature of the chamber 2 is efficiently carried out.

As is seen from FIG. 2, the temperature of the susceptor 15 stably showed 80° C. before induction of the ozone gas. However, when, during a temperature increasing period after the induction of the ozone gas, that is, at a temperature just before reaching 100° C., the light source 4 was turned off, the susceptor showed a peak of 103° C. Accordingly, by making a lamp control, such as adjusting the luminance, the temperature of the susceptor 15, namely the temperature of the substrate 16 can be controlled to the temperature of 100° C. or lower.

Figure 3:
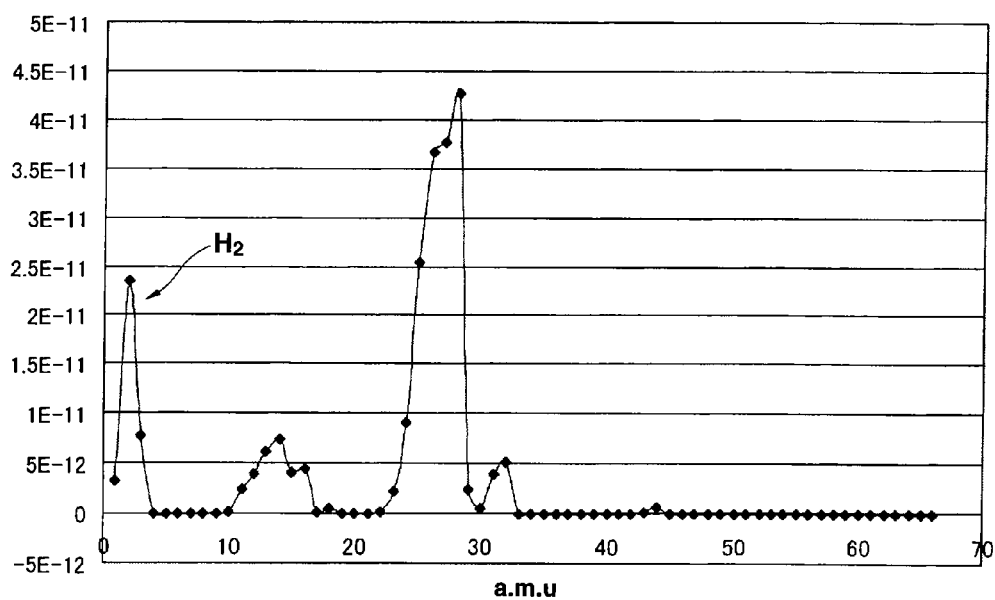
FIG. 3 is a graph showing a mass-spectrum during a reaction.

FIG. 3 shows a mass-spectrum during a reaction in the chamber 2. In a Q-mass-spectrum during the reaction, a peak of hydrogen appears, which brings about a possibility of generation of hydrogen radial in the process of the reaction (The Chemical Society of JAPAN edit.: Kikan Kagaku Sousetsu, No. 7, Chemistry of Active Oxygen, Apr. 20, 1990, p. 36-37). It is considered that the hydrogen radical contributes to a resist removing.

Figure 11:
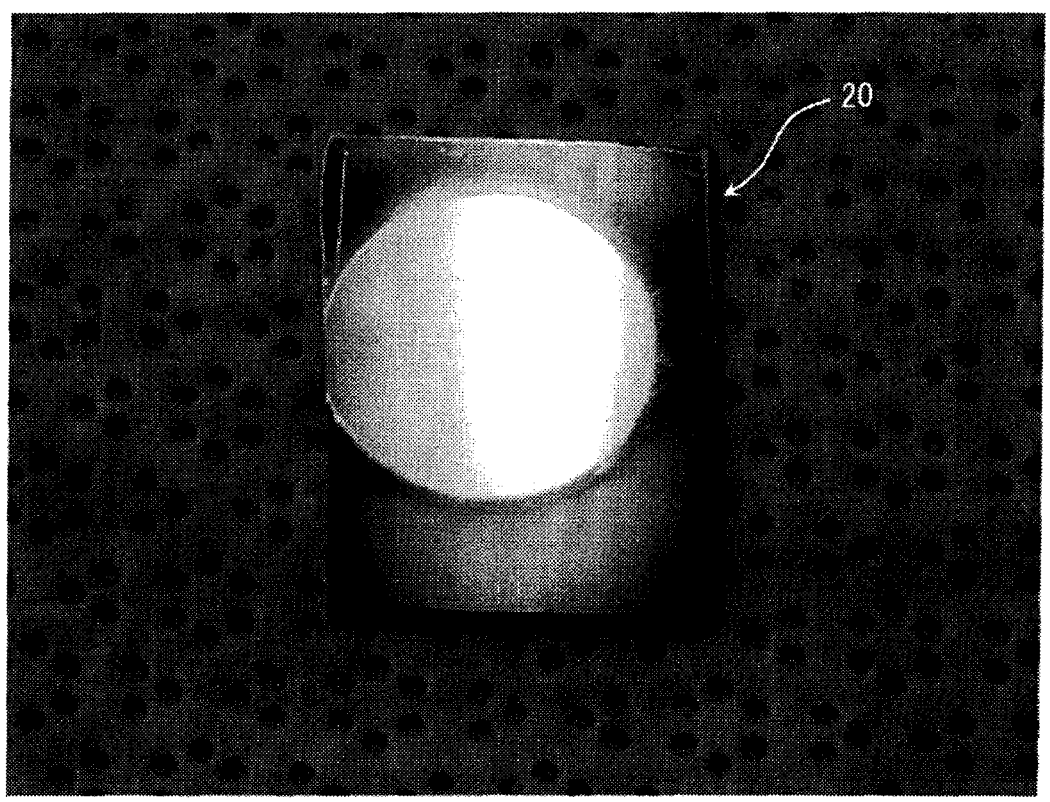
FIG. 11 is an appearance photo of the surface of a substrate that has been treated by the resist removing method of the embodiment of the invention.

FIG. 11 is an appearance photo of the surface of a is substrate that has been treated by the resist removing method of the embodiment. A circular blank portion shown in the photo is a portion where the resist was removed by ashing. More specifically, the photo shows an appearance of a substrate that had a resist for KrF implanted with 5E15 ions/cm$^2$ ($5\times10^{15}$ ions/cm$^2$) of P (phosphorus) and a surface of the substrate was subjected to an ashing treatment based on a time chart shown in FIG. 2. It was revealed that at around the maximum temperature of 103° C. of the susceptor 15, popping phenomenon did not occur. It seems that at such low temperature affection to the base layer of the substrate by ashing treatment is very small.

Figure 5:
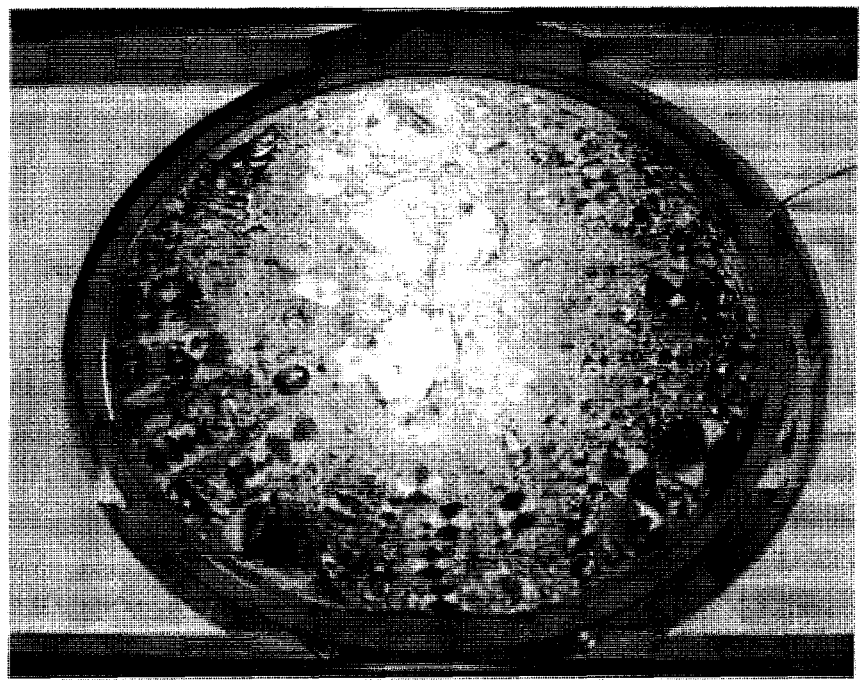
FIG. 5 is an appearance photo of a substrate surface that has been treated by a resist removing method using only ozone gas of an ozone concentration of 8 vol %.

On the other hand, FIG. 4 is an appearance photo of a substrate surface that has been treated by a comparative resist removing method. More specifically, the photo shows an appearance of a substrate that had a resist for KrF implanted with 5E15 ions/cm$^2$ ($5\times10^{15}$ ions/cm$^2$) of P (phosphorus) and was subjected to an ashing treatment by only using the ultra-high concentrated ozone gas at around a temperature of 400° C. of the susceptor 15. By this method, the resist was removed. However, by the high temperature, undesired popping occurred, and it was recognized that a surface hardened layer of the resist in the form of film-like fine particles adhered to walls of the chamber interior. It was further found that in case wherein the treatment was carried out by only ozone gas of ozone concentration of 8 vol % at a temperature of 400° C. of the susceptor 15, the undesired popping phenomenon took place (see FIG. 5).

Figure 6:
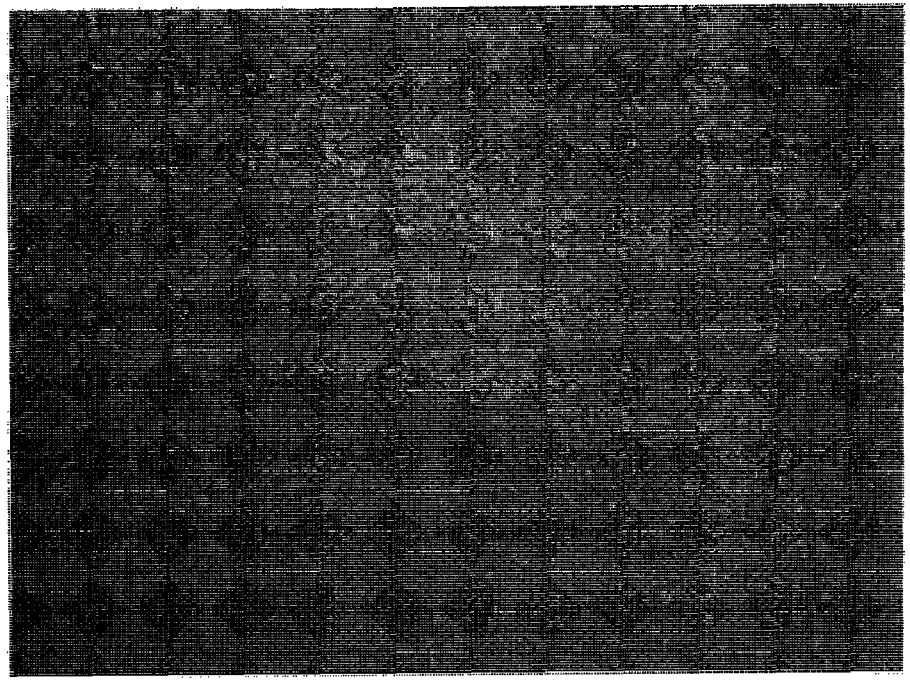
FIG. 6 is an enlarged surface photo (enlargement ratio=400) of a resist boundary portion of a substrate that has been treated by a resist removing method which is the embodiment of the invention.

FIG. 6 is an enlarged surface photo (enlargement ratio=400) of a resist boundary portion of a substrate that has been to treated by the resist removing method of the embodiment. From the photo, it was realized that no film-like peeled off particles were present and thus undesired popping phenomenon did not occur.

Figure 7:
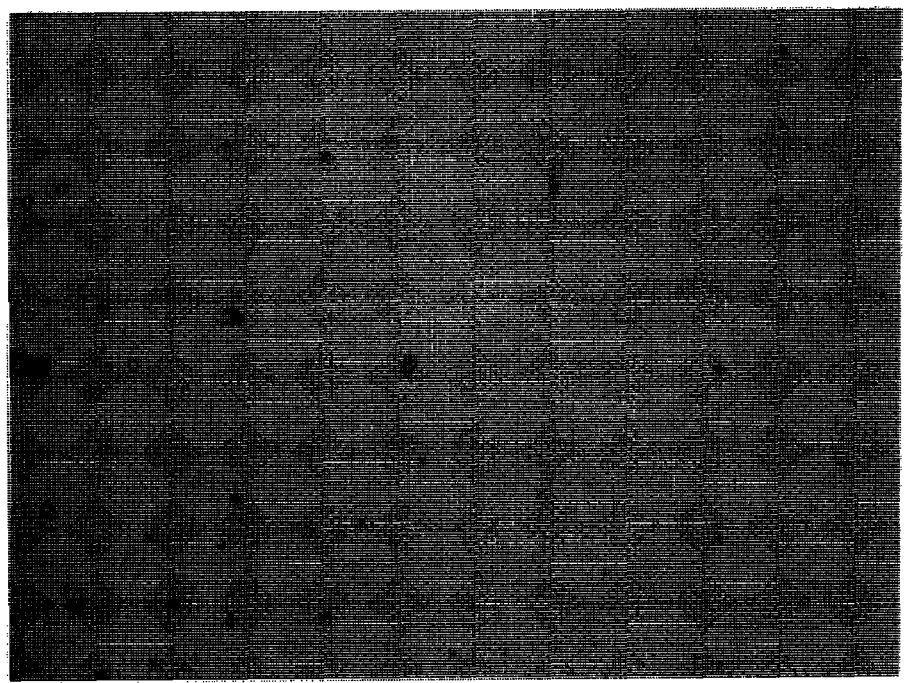
FIG. 7 is an enlarged surface photo (enlargement ratio=400) of a center portion of a substrate that has been treated by a resist removing method which is the embodiment of the invention.

FIG. 7 is an enlarged surface photo (enlargement ratio=400) of a center portion of a substrate that has been treated by the resist removing method of the embodiment. Although residue was found around a center surface, the amount of the residue is quite small as compared with that on the surface of the above-mentioned resist boundary portion. The amount of the residue tends to increase with passage of time after taking out from the chamber, and such residue can be removed or washed out by ultra-pure water. Accordingly, it is considered that these are not residue of the resist, but oxidized forms ($P_2O_5$ or $P_2O_3$) of the ions that were implanted in the resist. Implanted ions used in semiconductor production process form, by oxidation, water-soluble compounds whose vapor pressure is low, and thus, remain on the substrate after the treatment, and thus, it is considered that after the substrate is took out from the chamber, such water soluble compounds absorb water in the atmosphere and are observed as a surface residue.

The invention claimed is:

1. A method of removing a resist from a substrate, comprising:
    preparing a chamber;
    putting the substrate into the chamber;
    heating the substrate at about 100° C.;
    feeding the chamber with unsaturated hydrocarbons by such an amount that an interior of the chamber has a pressure of approximately 350 Pa;
    feeding the chamber with a concentrated ozone gas by such an amount that the interior of the chamber containing the unsaturated hydrocarbons has a pressure of approximately 700 Pa;
    feeding the chamber with water vapor by such an amount that the interior of the chamber containing the unsaturated hydrocarbons and the concentrated ozone gas has a pressure of approximately 1500 Pa, wherein the heating step and the feeding steps result in removal of resist from the substrate;
    stopping the feeding of the concentrated ozone gas into the chamber,
    stopping the feeding of the unsaturated hydrocarbons into the chamber;
    stopping the feeding of the water vapor into the chamber; and
    cleaning the substrate by using pure water.

2. A method of removing a resist from a substrate as claimed in claim 1, wherein the concentrated ozone gas is an ultra-high concentrated type with a concentration of approximately 100 vol %.

3. A method of removing a resist from a substrate as claimed in claim 2, wherein the feeding of the water vapor into the chamber is carried out after about 1 minute when the interior of the chamber is at a pressure of 700 Pa.

4. A method of removing a resist from a substrate as claimed in claim 3, wherein the stopping of the feeding of the ultra-high concentrated ozone gas into the chamber is carried out after about 4 minutes when the interior of the chamber is at a pressure of 1500 Pa.

5. A method of removing a resist from a substrate as claimed in claim 4, wherein the stopping of the feeding of the water vapor into the chamber is carried out after about 30 seconds when the feeding of the unsaturated hydrocarbons into the chamber is stopped.

* * * * *